(12) United States Patent
Moon et al.

(10) Patent No.: US 6,614,642 B1
(45) Date of Patent: Sep. 2, 2003

(54) CAPACITOR OVER PLUG STRUCTURE

(75) Inventors: Bum-ki Moon, Tokyo (JP); Moto Yabuki, Tokyo (JP); Gerhard Beitel, Kanagawa (JP); Nicolas Nagel, Kanagawa (JP); Andreas Hilliger, Kanagawa (JP); Takamichi Tsuchiya, Tokyo (JP)

(73) Assignees: Infineon Technologies Aktiengesellschaft, Munich (DE); Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/065,122

(22) Filed: Sep. 19, 2002

(51) Int. Cl.$^7$ ............................................. H01G 4/228

(52) U.S. Cl. ..................... 361/306.1; 361/309; 257/308

(58) Field of Search ........................ 361/301.3, 301.4, 361/306.3, 311–313, 321.2, 322; 257/295, 296, 306, 308, 303, 300, 532, 535, 750–754

(56) References Cited

U.S. PATENT DOCUMENTS

| | | | | |
|---|---|---|---|---|
| 5,825,609 A | * | 10/1998 | Andricacos et al. | 361/321.4 |
| 5,892,254 A | * | 4/1999 | Park et al. | 257/295 |
| 5,998,250 A | * | 12/1999 | Andricacos et al. | 438/240 |
| 6,104,049 A | * | 8/2000 | Solayappan et al. | 257/295 |
| 6,140,672 A | * | 10/2000 | Arita et al. | 257/295 |
| 6,407,422 B1 | * | 6/2002 | Asano et al. | 257/306 |

* cited by examiner

*Primary Examiner*—Anthony Dinkins
(74) *Attorney, Agent, or Firm*—Dexter Chin

(57) ABSTRACT

A capacitor over plug (COP) structure is disclosed. The COP avoids the step which is created in conventional COP structures, which adversely impacts the properties of the capacitor. In one embodiment, the step is avoided by providing a plug having upper and lower portions. The upper portion, which is coupled to the bottom electrode of the capacitor, has substantially the same surface area as the bottom electrode. A barrier layer can be provided between the plug and bottom electrode to avoid oxidation of the plug material.

17 Claims, 10 Drawing Sheets

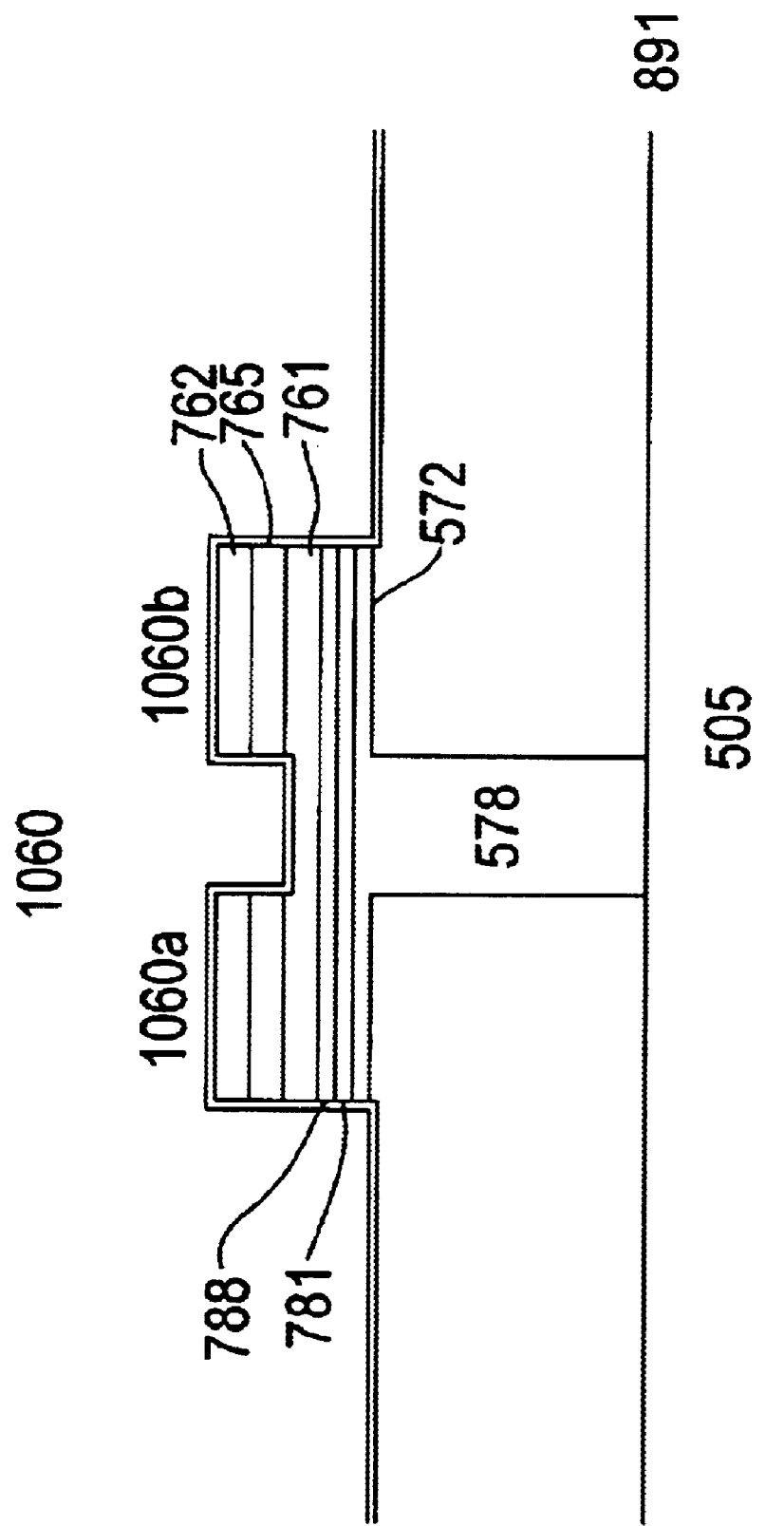

CAPACITOR OVER PLUG STRUCTURE

BACKGROUND OF INVENTION

Memory ICs comprise a plurality of memory cells interconnected by bitlines and wordlines. A memory cell includes a transistor coupled to a capacitor for storage of a bit of information. A gate terminal of the transistor is coupled to a wordline, a first terminal of the transistor is coupled to a bitline, and a second terminal of the transistor is coupled to a plate of the capacitor. The other plate of the capacitor, for example, is coupled to a reference voltage, such as $V_{DD}/2$ or ground. For ferroelectric memory cells, the other plate of the capacitor is coupled to a plateline.

To realize a high density memory ICs, the memory cells employ a capacitor over plug structure (COP), as shown in FIG. 1. The structure includes a capacitor 160 having a dielectric layer 165 located between first and second electrodes 161 and 162. The capacitor is coupled to a conductive plug 170. The plug, for example, is coupled to a diffusion region of a transistor. Depending on the application, a barrier layer 188 can be used to prevent diffusion of oxygen to the plug. Such barrier layers are particularly useful for ferroelectric or high k dielectric applications. When polysilicon (poly-Si) is used to form the plug, a metal suicide layer 181 is disposed between the plug and capacitor.

FIGS. 2–4 show a conventional process for forming the COP structure. As shown, an interlevel dielectric layer 230 is formed over a substrate 205. The substrate may include various circuit elements, such as transistors. A poly-Si plug 270 is formed in the ILD layer, contacting to, for example, a diffusion region of the transistor. The plug is formed by a conventional process which includes: a) forming the contact via in the ILD; b) depositing poly-Si on the substrate to fill the contact opening; and c) planarizing the substrate by chemical mechanical polishing (CMP) to remove excess poly-Si from the surface of the ILD.

The chemicals of the CMP cause a chemical oxide layer 272 to form over as well as in the grain boundaries of the poly-Si plug. The CMP step needs to be sufficiently long to ensure complete removal of the oxide over and in the poly-Si in order to have good contact properties. As shown in FIG. 3, the overpolishing process to remove the oxide from the poly-Si material causes a step 276 to form between the plug and surface of the ILD. This is due to the fact that the etch rate of the ILD material (e.g., silicon oxide) is faster than the etch rate of poly-Si.

After the plug is formed, a metal silicide layer is 380 selectively formed over the plug. The plug further increases the height the step over the plug. Thereafter, the various layers of the capacitors are deposited over the substrate, as shown in FIG. 4.

Such layers, for example, include a barrier 488, a first electrode 461, a dielectric 465, and a second electrode 462. The surface topography of the step is carried through to the various capacitor layers.

However, it has been found that the surface topography resulting from the plug formation can adversely impact the performance of the capacitor. For example, the step can degrade the barrier properties of the barrier layer or change the conductive or dielectric properties of the other layers.

From the foregoing discussion, it is desirable to provide an improved plug which does not adversely affect the properties of the subsequently formed layers.

SUMMARY OF INVENTION

The invention relates generally to integrated circuits. More particularly, the invention relates to forming capacitor over plug structures. In one embodiment, the capacitor over plug structure comprises a capacitor having a dielectric layer between first and second electrodes. A plug comprising conductive plug material is coupled to the first electrode of the capacitor. In one embodiment, the plug comprises upper and lower portions. The upper portion comprises a surface area substantially equal to that of the first electrode.

In one embodiment, the capacitor comprises a ferroelectric capacitor having a ferroelectric layer between the electrodes. The ferroelectric layer, for example, comprises PZT. A barrier layer can be located between the first capacitor electrode and plug material. The barrier layer prevents oxidation of the plug material. By providing a plug with upper and lower portions in which the upper portion is substantially equal to the surface area of the first electrode advantageously avoids the formation of the step between the plug and ILD layer in conventional capacitor over plug structures. As such, the adverse impact of the step to the properties of the capacitor is reduced or eliminated.

BRIEF DESCRIPTION OF DRAWINGS

FIG. 10 shows yet another embodiment of the invention.

DETAILED DESCRIPTION

Figure 1:
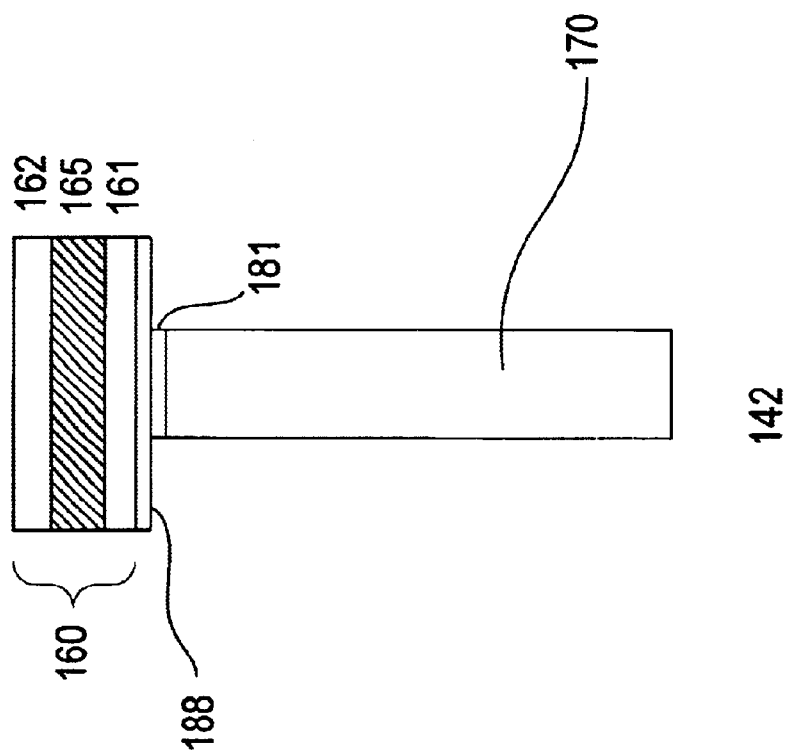
FIG. 1 shows a conventional COP structure.
Figure 2:
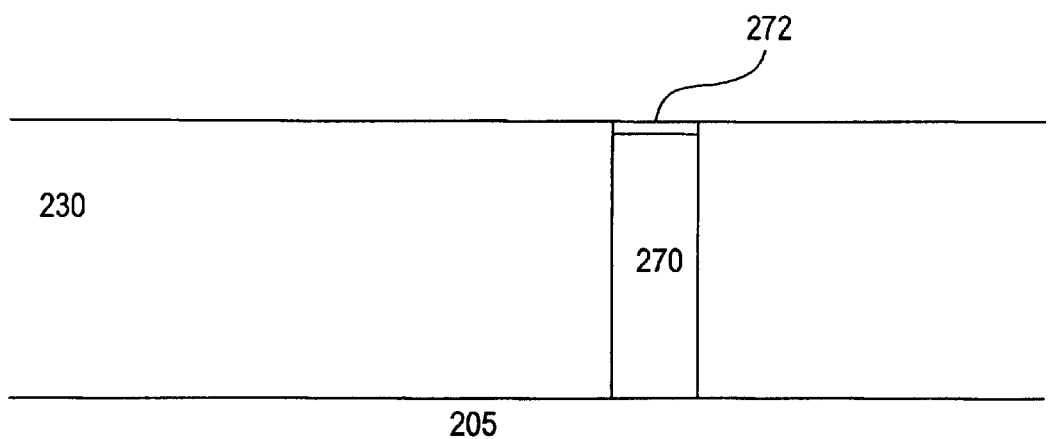
FIGS. 2–4 show a conventional process of forming a COP structure.
Figure 3:
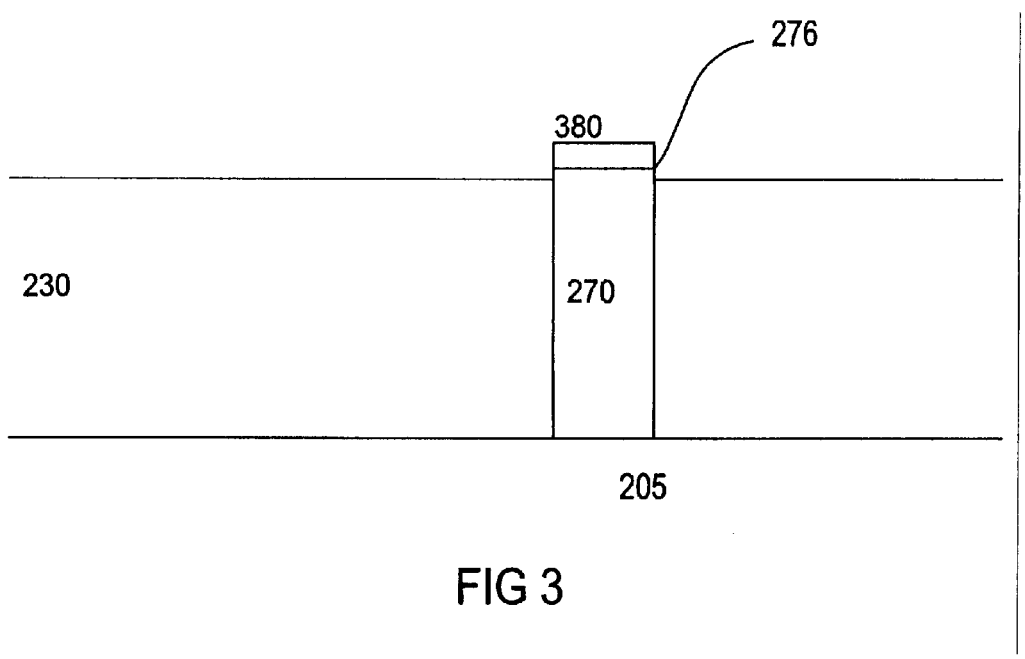
Figure 4:
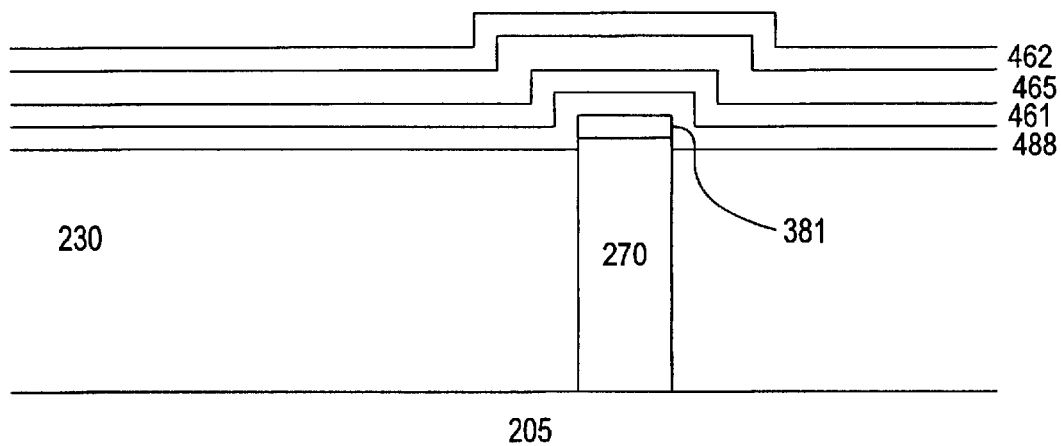
Figure 5:
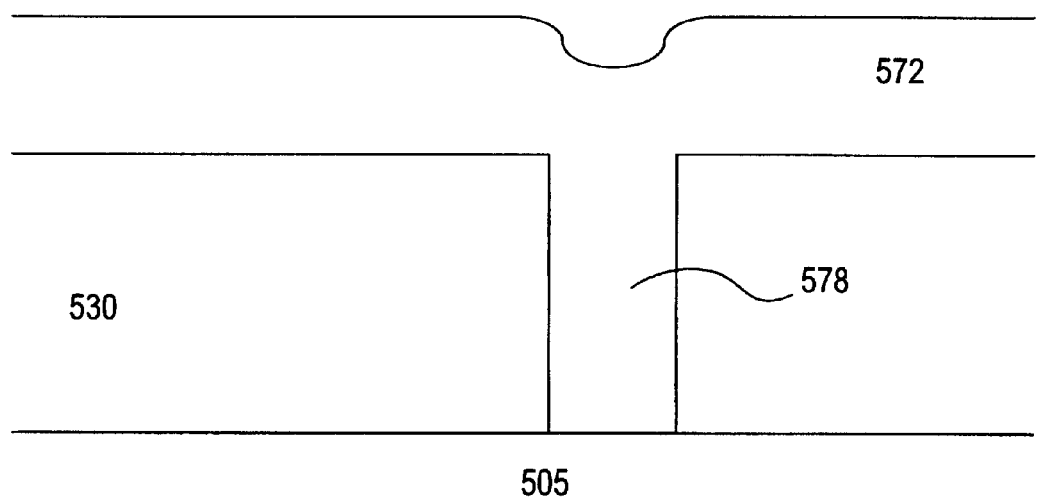
FIGS. 5–8 show process for forming a COP structure in accordance with one embodiment of the invention.

FIGS. 5–8 show one embodiment of the invention for forming a COP structure. Referring to FIG. 5, a semiconductor substrate 505 prepared with a contact opening 578 in an ILD layer 530 is provided. The ILD layer, for example, comprises silicon oxide. Other types of dielectric materials, such as silicon nitride, doped or undoped silicate glass, or spin-on glass, can also be used. Various techniques, such as chemical vapor deposition (CVD), can be used to form the ILD layer.

In one embodiment, the contact opening is formed using conventional mask and etch techniques. For example, a photoresist layer deposited on the ILD layer and patterned to form a window corresponding to where the contact opening is to be formed. An anisotropic etch, such as reactive ion etch (RIE) is then performed to remove the portion of the ILD layer exposed by the resist window, thereby exposing a conductive region. The conductive region, for example, is a diffusion region of a transistor. The transistor and capacitor, for example, forms a memory cell. A plurality of memory cells can be interconnected by bitlines and wordlines to form a memory array of an integrated circuit. In one embodiment, the memory cells are separated into groups to form a series architecture. Series architectures are described in, for example, Takashima et al., "High Density Chain Ferroelectric Random Access Memory (chain FRAM)", IEEE Jrnl. of Solid State Circuits, vol.33, pp.787–792, May 1998, which is herein incorporated by reference for all purposes. Other types of architectures, such as open bitline or folded bitline, are also useful.

A conductive layer 572 is then deposited on the substrate, filling the contact opening. In one embodiment, the conductive layer comprises poly-Si. Other conductive materials can also be useful. The poly-Si layer can be deposited by, for example, CVD. Other deposition techniques, such as chemical solution deposition (CSD), electro-plating, hydrothermal synthesis or physical vapor deposition (PVD), are also useful.

Figure 6:
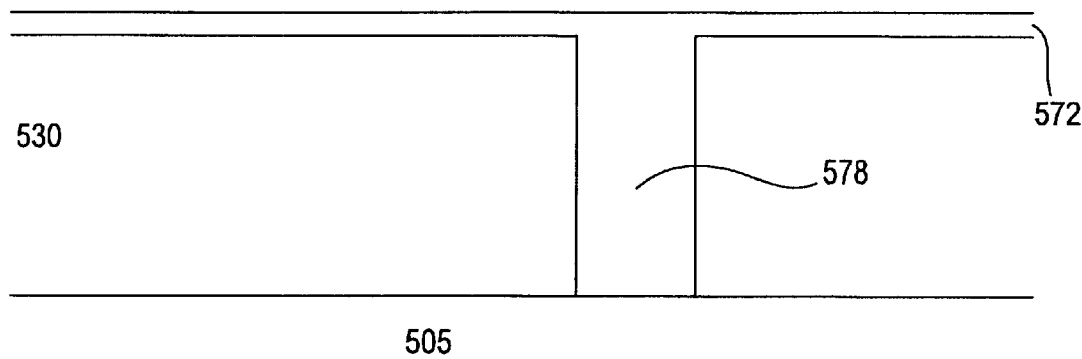

Referring to FIG. 6, the poly-Si layer is partially removed by polishing the surface of the substrate. In one embodiment, the polishing comprises CMP. The polishing step produces a planar surface on the poly-Si layer. In accordance with one embodiment of the invention, the CMP planarizes the poly-Si without removing the poly-Si from the surface of the ILD. The CMP causes a chemical oxide to form on the surface of the poly-Si layer. To reduce contact resistance, the chemical oxide layer is removed. In one embodiment, a wet etch is used to remove the chemical oxide from the surface of the poly-Si layer. The wet etch, for example, uses a dilute HF chemistry. The poly-Si layer remaining on the surface of the ILD after the CMP step should be sufficiently thick to at least enable the removal of the chemical oxide layer without exposing the underlying ILD layer. The poly-Si layer, for example, can be about several nanometers to several hundred nanometers thick. Providing a poly-Si layer having other thickness values is also useful.

Figure 7:
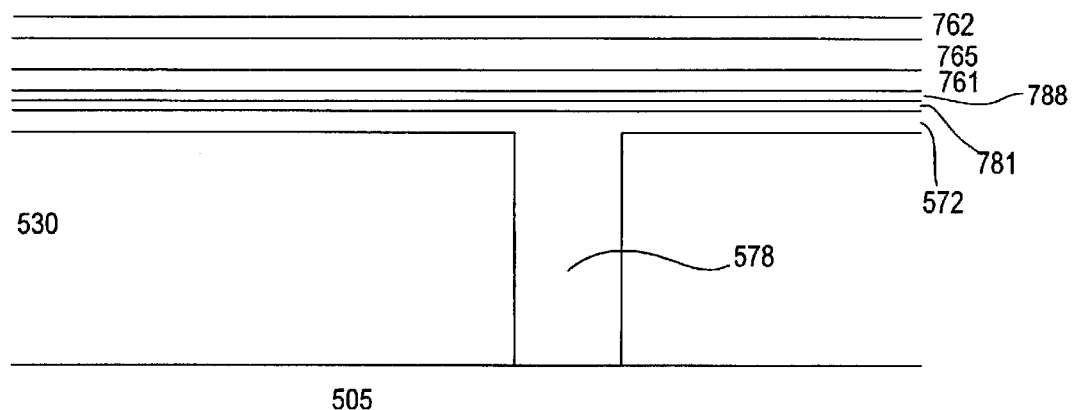

Referring to FIG. 7, a metal layer 781 is deposited on the planar poly-Si layer. The metal layer serves as the base layer from which a metal silicide layer is formed. In one embodiment, the metal layer comprises titanium or cobalt. Other metal layers can also be used to form the base layer for forming the metal suicide. Various deposition techniques, such as CVD, CSD, electro-plating, hydrothermal synthesis or physical vapor deposition (PVD) are useful to form the metal layer.

After the metal layer is deposited, a thermal silicidation process is performed to form a metal silicide layer. The silicidation process comprises, for example, a two step annealing process. In the first step, the substrate is annealed in a nitrogen ambient. In one embodiment, the anneal comprises a rapid thermal anneal (RTA) at 620–680° C. for about 30 sec. In the second step, the substrate is annealed by, for example, an RTA at 700–780° C. for about 30 sec. In a preferred embodiment, a wet chemical etch is performed to remove unreacted metal from the metal layer after the first RTA step. This ensures that only silicide phase results after the second RTA step. The suicide layer reduces or minimizes diffusion of silicon (Si) from the plug into the capacitor layers above.

After the suicide layer is formed, the various layers of the capacitor are deposited on the substrate. In one embodiment, the capacitor layers comprise layers for forming a ferroelectric capacitor. Alternatively, the capacitor layers are used to form dynamic random access memory capacitors. Other types of capacitors can also be formed.

To form a ferroelectric capacitor, a conductive barrier 788, first electrode 761, ferroelectric layer 765 and second electrode 762 are sequentially deposited on the substrate. In one embodiment, the electrode material comprises a noble metal such as platinum, the ferroelectric material comprises lead zirconium titanate (PZT), and the barrier layer comprises a conductive barrier material against oxygen, such as iridium. Other conductive, ferroelectric, or barrier materials can also be used. For example, strontium bismuth tantalum (SBT), can also be used to form the ferroelectric layer. An adhesion layer can be provided beneath the barrier layer to promote adhesion between the substrate and barrier layer, if necessary. The adhesion layer, for example, comprises titanium. Other types of adhesion promoting materials, such as titanium nitride (TiN), tantalum (Ta), tantalum nitride (TaN), tantalum silicon nitride (TaSiN) and titatium aluminum nitride (TIAIN) can also be used. The various layers can be deposited using conventional deposition techniques, such asPVD, CVD and spin-on.

Figure 8:
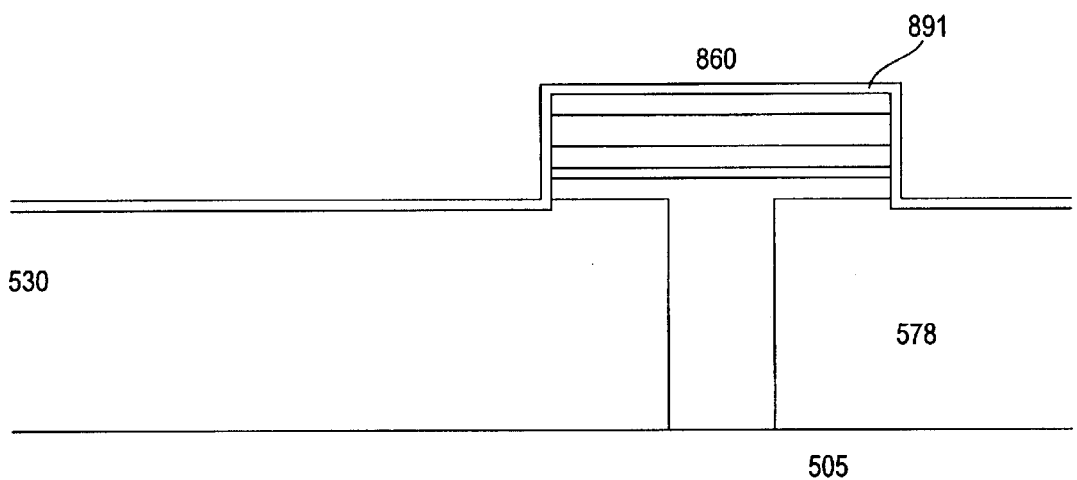

Referring to FIG. 8, the various layers on the ILD are patterned to form a capacitor 860. Conventional mask and etch techniques can be used to pattern the various layers. For example, a photoresist layer is deposited on the top capacitor layer and patterned, leaving a resist block to protect the capacitor layers in the region corresponding to the area of the capacitor. An anisotropic etch, such as an RIE, is used to remove the portion of the capacitor layers unprotected by the resist block, thus forming the capacitor. In one embodiment, the RIE overetches the layers, removing a portion of the ILD layer. This ensures that the poly-Si beyond the capacitor is completely removed.

In one embodiment, an encapsulation layer 891 is deposited over the capacitor. The encapsulation layer, which serves to protect sidewall and interfacial diffusion of oxygen during annealing, comprises, for example, silicon nitride or aluminum oxide. Other types of materials such as $TiO_2$, $CeO_2$ or $ZrO_2$ can also be used.

As can be seen, the present invention avoids creating the step of conventional processes by not polishing the plug material down to the ILD. By providing a planar surface on which the various capacitor layers are formed, degradation to the capacitor is avoided. Furthermore, the poly-Si forms a strong bond with the ILD, thus effectively reducing lateral diffusion of oxygen to the plug through the plug/ILD interface.

Figure 9:
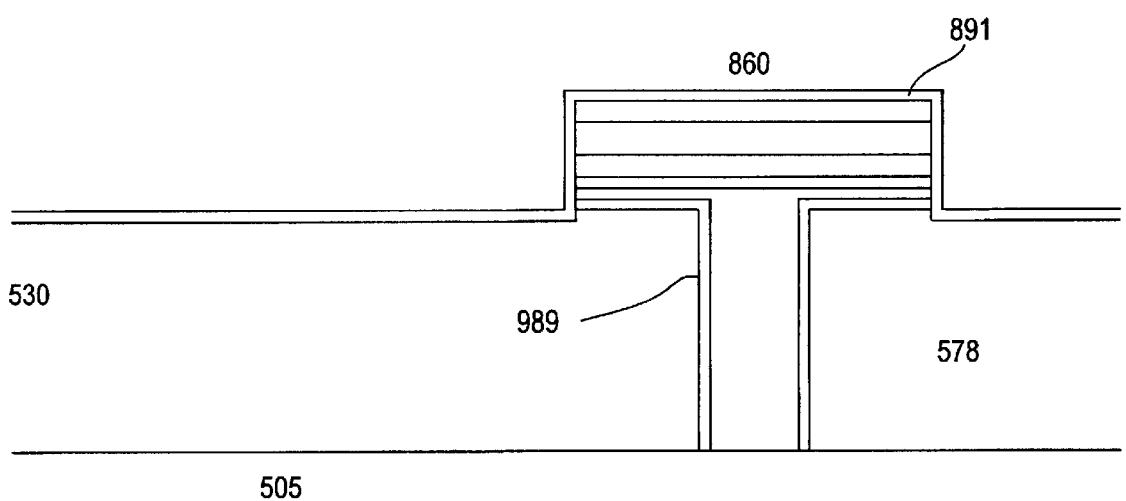
FIG. 9 shows an alternative embodiment of the invention.

In another embodiment, as shown in FIG. 9, an oxygen barrier layer 989 lines the plug sidewalls. In one embodiment, the oxygen barrier comprises silicon nitride or aluminum oxide. Other types of oxygen barrier materials can also be used. If the oxygen barrier is non-conductive, it is removed from the bottom of the plug opening. The barrier layer can be deposited prior to filling the plug opening. By lining the plug sidewalls with a barrier layer, oxygen diffusion along the plug/ILD interface or-the plug is reduced or avoided. The process continues, for example, to complete formation of the memory cell.

In yet another embodiment, the various capacitor layers can be patterned to form a capacitor pair 1060, as shown in FIG. 10. Such a capacitor pair is used in, for example, series memory architectures. Series memory architectures, for example, are described in Takashimna et al., "High Density Chain Ferroelectric Random Access Memory (Chain FRAM), Journal of solid-State Circuits, Vol. 22 (May 1988), which is already incorporated by reference for all purposes. The capacitor pair includes first and second capacitors 1060a–b, each with a dielectric layer 765 between first and second electrodes 761 and 762. The first electrode of the capacitors is a common electrode. An encapsulation layer 891 can be deposited over the capacitor pair and substrate. Similar to the capacitor structure shown in FIG. 8 or 9, the upper portion 572 of the plug comprises substantially the same surface area as the first electrode.

While the invention has been particularly shown and described with reference to various embodiments, it will be recognized by those skilled in the art that modifications and changes may be made to the present invention without departing from the spirit and scope thereof. The scope of the invention should therefore be determined not with reference to the above description but with reference to the appended claims along with their full scope of equivalents.

What is claimed is:

1. A capacitor over plug structure comprising:
   a capacitor having a bottom electrode, the bottom electrode comprising a bottom electrode surface area; and
   a plug comprising a conductive plug material coupled to the bottom electrode, the plug includes upper and lower portions, wherein the upper portion comprises an upper plug surface area substantially-equip to the bottom electrode surface area.

2. The capacitor over plug structure of claim 1 is a part of a memory cell.

3. The capacitor over plug structure of claim 2 further comprises a plurality of memory cells to form a memory array.

4. The capacitor over plug structure of claim 3 wherein the capacitor further includes a dielectric layer between a top electrode and the bottom electrode, the dielectric layer comprises a ferroelectric layer.

5. The capacitor over plug structure of claim 2 wherein the memory array is arranged in a series architecture.

6. The capacitor over plug structure of claim 5 wherein the capacitor further includes a dielectric layer between a top electrode and the bottom electrode, the dielectric layer comprises a ferroelectric layer.

7. The capacitor over plug structure of claim 1 wherein the capacitor further includes a dielectric layer between a top electrode and the bottom electrode, the dielectric layer comprises a ferroelectric layer.

8. The capacitor over plug structure of any of claims 1–7 wherein the plug material comprises polysilicon or tungsten.

9. The capacitor over plug structure of claim 8 further comprises a barrier layer between the bottom electrode and the plug.

10. The capacitor over plug structure of claim 9 further comprises a silicide layer between the barrier layer and the plug.

11. The capacitor over plug structure of claim 8 further comprises an encapsulation layer over the capacitor to protect the capacitor from diffusion of oxygen.

12. A capacitor over plug structure comprising:
    a capacitor pair having first and second capacitors, wherein the first and second capacitors comprise a common bottom electrode, the common bottom electrode comprising a bottom electrode surface area; and
    a plug comprising a conductive plug material coupled to the common bottom electrode, the plug includes upper and lower portions, wherein the upper portion comprises an upper plug surface area substantially equal to the bottom electrode surface area.

13. The capacitor over plug structure of claim 12 wherein the capacitors comprise ferroelectric capacitors.

14. The capacitor over plug structure of claim 12 or 13 wherein the plug material comprises polysilicon or tungsten.

15. The capacitor over plug structure of claim 14 further comprises a barrier layer between the plug and bottom electrode.

16. The capacitor over plug structure of claim 15 further comprises a silicide layer between the barrier layer the plug material.

17. The capacitor over plug structure of claim 14 further comprises an encapsulation layer over the capacitor to protect the capacitor from diffusion of oxygen.

* * * * *

UNITED STATES PATENT AND TRADEMARK OFFICE
CERTIFICATE OF CORRECTION

PATENT NO. : 6,614,642 B1
APPLICATION NO. : 10/065122
DATED : September 2, 2003
INVENTOR(S) : Bum-ki Moon et al.

Page 1 of 1

It is certified that error appears in the above-identified patent and that said Letters Patent is hereby corrected as shown below:

In column 1, lines 23-25 - replace "When polysilicon (poly-Si) is used to form the plug, a metal suicide layer 181 is disposed between the plug and capacitor." with -- When polysilicon (poly-Si) is used to form the plug, a metal silicide layer 181 is disposed between the plug and capacitor. --

In column 3, line 28 - replace "Other metal layers can also be used to form the base layer for forming the metal suicide." with -- Other metal layers can also be used to form the base layer for forming the metal silicide.--

Col. 5, lines 7-9 - replace "wherein the upper portion comprises an upper plug surface area substantially-equip to the bottom electrode surface area." with -- wherein the upper portion comprises an upper plug surface area substantially equal to the bottom electrode surface area. --

Signed and Sealed this

Fourteenth Day of November, 2006

JON W. DUDAS
*Director of the United States Patent and Trademark Office*

UNITED STATES PATENT AND TRADEMARK OFFICE
CERTIFICATE OF CORRECTION

PATENT NO. : 6,614,642 B1
APPLICATION NO. : 10/065122
DATED : September 2, 2003
INVENTOR(S) : Bum-ki Moon et al.

It is certified that error appears in the above-identified patent and that said Letters Patent is hereby corrected as shown below:

Claim 1, Column 5, Line 8 - replace "substantially-equip to" with --substantially equal to --

Signed and Sealed this

Sixth Day of November, 2007

JON W. DUDAS
*Director of the United States Patent and Trademark Office*